United States Patent [19]

Single

[11] Patent Number: 4,631,694
[45] Date of Patent: Dec. 23, 1986

[54] SINE WAVE SYNTHESIZER

[75] Inventor: Peter S. Single, San Jose, Calif.

[73] Assignee: National Semiconductor Corporation, Santa Clara, Calif.

[21] Appl. No.: 604,718

[22] Filed: Apr. 27, 1984

[51] Int. Cl.[4] .............................................. G06F 1/02
[52] U.S. Cl. .................................... 364/608; 364/607; 364/851
[58] Field of Search ............... 364/607, 718, 721, 851, 364/608; 328/142; 307/263, 228, 490

[56] References Cited

U.S. PATENT DOCUMENTS

| | | | |
|---|---|---|---|
| 3,735,110 | 5/1973 | LeConte | 364/729 |
| 3,898,446 | 8/1975 | Vatz | 364/721 X |
| 4,068,178 | 1/1978 | Tunzi | 364/718 X |
| 4,142,245 | 2/1979 | Baron | 364/721 X |
| 4,159,526 | 6/1979 | Mosey, Jr. et al. | 364/721 |
| 4,192,007 | 3/1980 | Becker | 364/721 |
| 4,346,448 | 9/1982 | Insam et al. | 364/607 |
| 4,392,245 | 8/1982 | Gross | 364/718 X |
| 4,410,955 | 10/1983 | Burke et al. | 364/721 X |
| 4,482,974 | 11/1984 | Kovalick | 364/607 |
| 4,486,846 | 12/1984 | McCallister | 364/721 |

Primary Examiner—Jerry Smith
Assistant Examiner—Charles B. Meyer
Attorney, Agent, or Firm—Gail W. Woodward; Paul J. Winters

[57] ABSTRACT

A sine wave synthesizer is employed in an analog signal processing integrated circuit. The circuit includes an integrator driven from a plurality of integration constant capacitors which are sequentially selected by a clocked decoder. Each capacitor is selected by coupling it between the integrator and a switched reference source. The capacitors are selected so that their sequential selection produces a sine wave approximating current in four increments. A first increment of a sine wave is produced according to an ascending selection of integration constant capacitors. Thereafter, the capacitors are selected in reverse in a descending manner to produce a second increment of the sine wave. The switched capacitor phasing circuit is then operated to invert the sine wave signal to produce the third and fourth increments having a negative instead of a positive excursion. The frequency of the sine wave is controlled by the decoder clock input. An output filter stage converts the digitally produced sine wave increments into a smooth sine wave output. This filter is provided with selectable time constants to allow operation at different selected frequencies.

13 Claims, 5 Drawing Figures

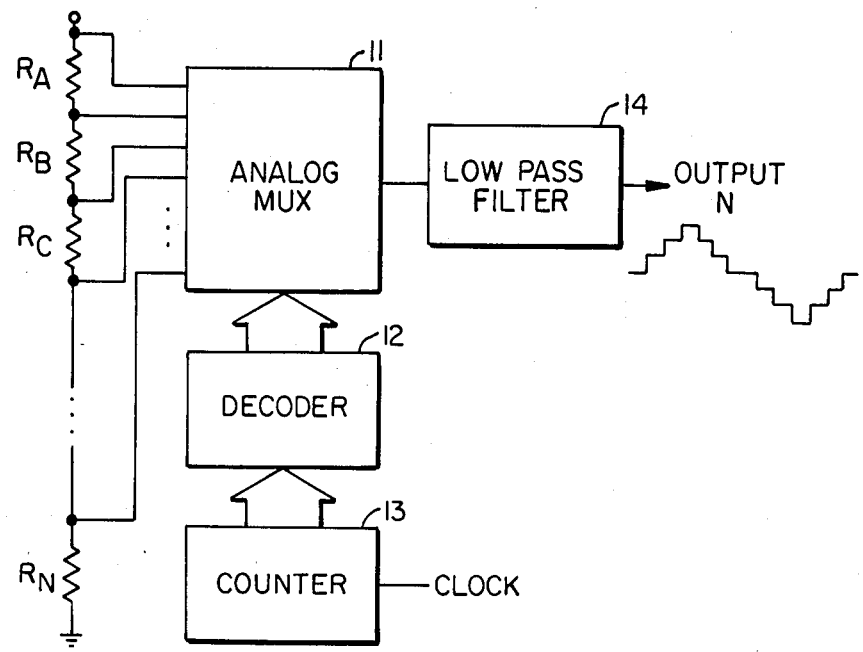
FIG._1. (PRIOR ART)
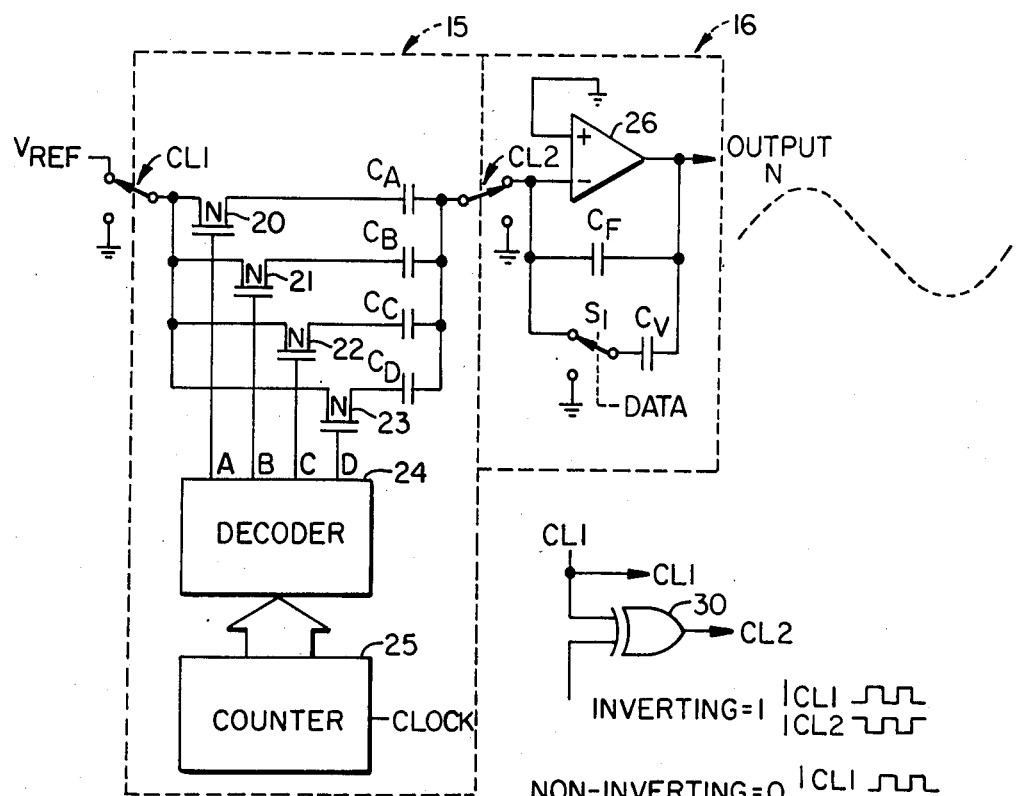
FIG._2.

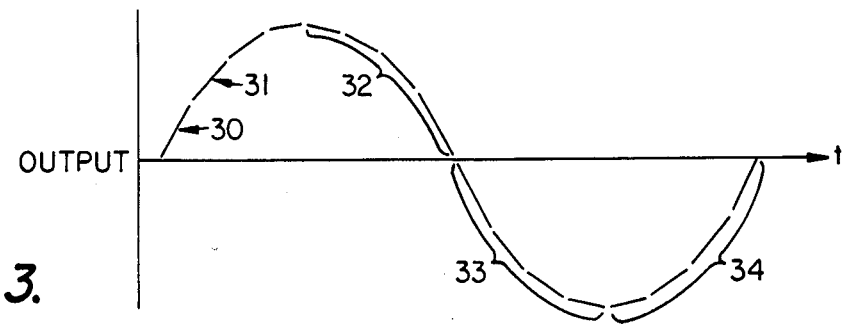
FIG._3.
| CL1 XOR CL2 | 0 0 0 0 1 1 1 1 1 1 1 1 0 0 0 0 |
|---|---|
| DECODER TERMINAL / SWITCH | |
| A  20 | 1 0 0 0 0 0 0 1 1 0 0 0 0 0 0 1 |
| B  21 | 0 1 0 0 0 0 1 0 0 1 0 0 0 0 1 0 |
| C  22 | 0 0 1 0 0 1 0 0 0 0 1 0 0 1 0 0 |
| D  23 | 0 0 0 1 1 0 0 0 0 0 0 1 1 0 0 0 |
FIG._4.

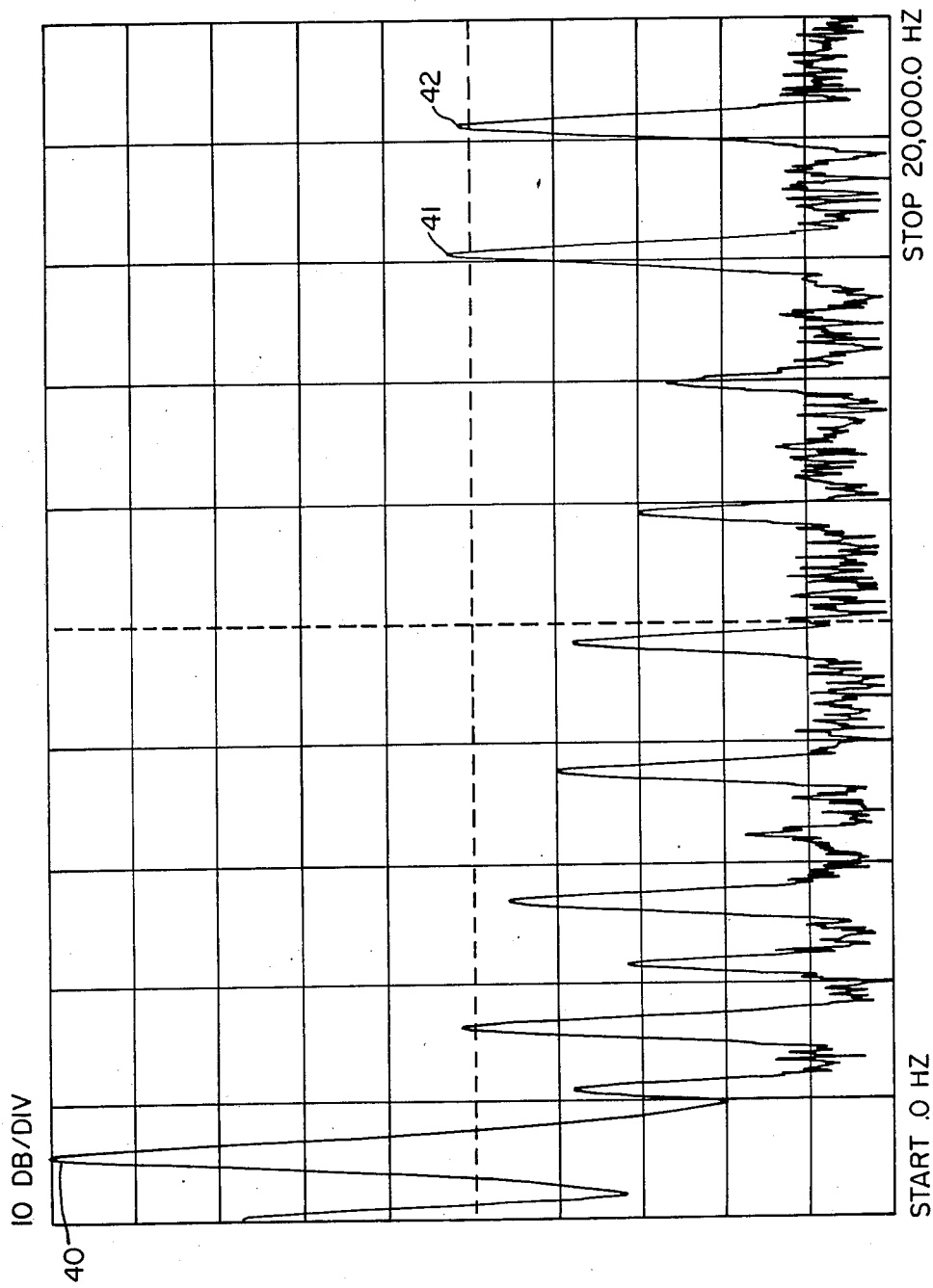
FIG._5.

SINE WAVE SYNTHESIZER

BACKGROUND OF THE INVENTION

1. Field of the Invention

The present invention relates to sine wave synthesis. More particularly, the present invention relates to digital generation of a sine wave signal at selected frequencies.

2. Description of the Prior Art

One of the many known methods of generating a sine wave signal is shown in block schematic form in FIG. 1. A resistive voltage divider network $R_A$-$R_N$ provides various selectable fixed DC voltage steps. These voltage steps correspond to instantaneous sine wave curve values and are coupled to an analog multiplex (mux) circuit, such as analog mux 11. A decoder 12 operates with analog mux 11 to select in a repeating ascending and descending order the various steps along the voltage divider circuit to assemble the desired sine wave in proper sequence. A counter 13 receives a clock signal and produces timing signals that operate decoder 12 and that accordingly determine the rate at which the sine wave is generated, and therefore the frequency of the generated sine wave. A staircase sine wave approximation output from analog mux 11 is coupled through a low pass filter 14, by which voltage transitions along the curve are smoothed, to provide the output sine wave signal.

Such known sine wave generator circuits require complex arrangements of electrical components, some of which are analog and some of which are digital. It is very difficult to integrate such diverse circuit elements onto a semiconductor substrate. For example, known sine wave generator circuits require a digital-to-analog conversion input terminal for each voltage level of the generated sine wave. If the number of input steps are reduced, then waveform approximation is simplified, but the generated sine wave output signal more resembles a coarse staircase waveform than a sine wave. Such coarse staircase waveforms are of little use without significant complex filters. Such filters are difficult to integrate onto a semiconductor substrate without using considerable and precious space on the substrate, without adding expensive and time-consuming fabrication steps, and without causing waveform degrading amplitude, harmonic, and phase distortion.

SUMMARY OF THE INVENTION

The present invention provides a sine wave synthesizer for use in a signal processing circuit, such as a frequency shift keying (FSK) modulator. The invention has high spectral purity, a stable sloped line sine wave approximation output, spike-free frequency transitions, and a compact circuit layout that is readily integrated onto a semiconductor substrate in a minimum amount of space.

The invention exploits the redundant and symmetrical nature of a sine wave by providing a switched capacitor sine wave digital-to-analog converter. Such circuit operates in accordance with the inventor's recognition that a sine wave includes symmetrical left and right side information for each positive and negative excursion of the waveform, and also includes symmetrical information for the positive and negative excursion of the waveform. That is, a sine wave may be divided into four portions: an upper left portion, an upper right portion, a lower left portion, and a lower right portion. The right portions are mirror images of the left portions; the upper portions combined form a mirror image of the combined bottom portions. Accordingly, the present invention, when using the same data rate as prior art circuits, increases the number of discrete steps in any generated waveform by a factor of two. Conversely, the number of components required to produce a waveform generator circuit is reduced by a factor of two or greater.

The present invention has components for generating only one quarter of the sine wave output. However, by operating the circuit in the correct manner, this one fourth is reproduced four times, once for each portion of the sine wave. A switched variable resistance element is sequentially operated to provide lower left and upper left portions of the sine wave. This variable resistance element is composed of a switched capacitor circuit. By controlling the switching to this circuit it is possible to reverse the direction of current flow through the variable resistance element, and so produce the upper right and lower right portions of the sine wave. This cycle is repeated at a rate corresponding to the desired output frequency.

A filtering stage having selectable properties follows the variable resistance element. In the present invention the filter consists of an integrator which integrates the current passing through the variable resistance element to produce an output voltage. Through the use of a filter with selectable properties the present invention can produce a sine wave having any of several frequencies and yet continue to provide a precise and stable output waveform.

The filter with selectable properties may have its properties altered during circuit operation without producing discontinuities in its output. This allows at least two frequencies to be passed through the filter, while the transition from one frequency to another may occur without any amplitude or phase distortion being produced by the filter.

DESCRIPTION OF THE DRAWINGS

FIG. 1 is a block and partial schematic diagram of a prior art sine wave generator circuit;

FIG. 2 is a block and partial schematic diagram of a preferred embodiment of the present invention;

FIG. 3 shows a waveform produced by the present invention;

FIG. 4 is a truth table showing the clock and transistor states that produce the waveform of FIG. 3; and FIG. 5 is a plot of a produced output waveform showing fundamental and harmonic waveform components.

DESCRIPTION OF THE PREFERRED EMBODIMENT

The present invention provides a digitally controlled analog sine wave synthesizer. A preferred embodiment is shown in schematic form in FIG. 2, and includes: a digitally controlled sine wave synthesis circuit 15, and an analog integrator/output filter circuit 16.

Switches CL1 and CL2 are operated at a rate much greater than the frequency of the sine wave in the particular example, at 450 KHz. They are operated at the same rate either in phase or out of phase. These switches, combined with capacitors $C_A$-$C_D$, produce a variable resistance element. The voltage $V_{REF}$ induces a current in this variable resistance element. This current is then integrated by amplifier 26 in conjunction with the feedback capacitor $C_F$.

Clocked switches CL1 and CL2 are operated in-phase to produce a first sine wave slope and are operated 180° out-of-phase to produce a second sine wave slope. Clock signal CL2 is synthesized from clock signal CL1 at exclusive-OR gate 30. Phase inversion of clock signal CL1 (and correspondingly clock signal CL2) is accomplished by supplying a logic "1" to exclusive-OR gate 30; in-phase clock signals CL1 and CL2 operation is provided by supplying a logic "0" to exclusive-OR gate 30. Clock signal CL1 is coordinated with the CLOCK signal and may be easily derived therefrom. The inverting and non-inverting control signal supplied to exclusive-OR gate 30 may be software or hardware derived as desired and in accordance with FIG. 4.

The current passing through the variable resistance element is controlled by selecting one of the capacitors $C_A$-$C_D$. The capacitor chosen with switches 20-23 selects the current to the integrator, and thus the charge rate of the capacitor $C_F$. The charging (or discharging) of capacitor $C_F$ produces an output of the circuit which consists of a ramp. The slope of this ramp depends on which of the capacitors $C_A$-$C_D$ has been selected. In the preferred embodiment of the invention, capacitors $C_A$-$C_D$ may be fractional capacitors formed according to the "T" to "$\pi$" conversion, as described in applicant's copending application, Ser. No. 604,759, filed 4-27-84.

A capacitor $C_F$ is coupled between the output of amplifier 26 and the inverting input of amplifier 26. A second capacitor $C_V$ is coupled in parallel with capacitor $C_F$ or coupled to ground as selected by operation of a switch S1 in response to a switch control signal DATA.

Operation of the circuit of FIG. 2 is best understood by referring to FIG. 3, which is a diagram showing a sloped line approximation sine wave output signal produced by the circuit; and FIG. 4, which is a truth table showing the operation of switches 20-23 by decoder 24 and of clocked switches CL1 and CL2. Referring to FIG. 4, a first segment of the output sine wave is generated by providing a high or 'one' output signal at terminal A of decoder 24. This output signal operates switch 20, thereby coupling source voltage $V_{REF}$ to capacitor $C_A$. A corresponding charge is intergrated by capacitor $C_F$. The combination of capacitor $C_F$ and amplifier 26 provides an integrator circuit. Thus, a first ascending segment 30 of the sine wave output signal is produced, as shown in FIG. 3.

Segment 31 along the sine wave output signal (FIG. 3) is a second segment of the sine wave output signal. The second segment is produced in a like manner as the first segment by providing a high or 'one' output signal at terminal B of decoder 24 to operate switch 21 and thereby couple source voltage $V_{REF}$ to capacitor $C_B$.

The described process is repeated for capacitors $C_C$ and $C_D$ until a first portion (four segments, in the depicted embodiment) of the sine wave is produced. In FIG. 2, four switches 20-23 and four corresponding capacitors $C_A$-$C_D$ are provided. Thus, there are four discrete steps in the production of the first portion of the synthesized sine wave. Other embodiments of the invention may incorporate additional switches (which may be transistors) and capacitors to produce a wave form having more, and therefore smoother, transitions.

After the first portion of the sine wave is produced, clocked switches CL1 and CL2 are operated as an inverter (exclusive-ORed) to produce a second and third portion of the output sine wave shown by designators 32 and 33 in FIG. 3. In producing second and third portions of the sine wave, decoder 24 operates switches 20-23 to select capacitors $C_A$-$C_D$ in a descending and ascending integration value order in the same way as for the first portion 30 of the sine wave output signal. Out-of-phase operation of clocked switches CL1 and CL2 inverts the signal produced and a second and third portion of the sine wave is thus generated.

To produce the fourth portion 34 of the sine wave, the order in which capacitors $C_A$-$C_D$ are coupled to amplifier 26 is reversed and clocked switches CL1 and CL2 are operated in-phase. The resulting output voltage produced by amplifier 26 becomes an ascending value. In this way, a fourth portion of the sine wave curve is produced.

Referring to FIG. 4, it can be seen that operation of switches 20-23 is identical for the positive excursion of the sine wave and for the negative excursion of the sine wave. It is the in-phase or out-of-phase operation of clocked switches CL1 and CL2 that determines if the increasing (or decreasing) value of the curve is a positively increasing (or decreasing) or negatively increasing (or decreasing) value.

Decoder 24 operates switches 20-23 in sequence at a rate controlled by counter 25. In this way an accurate output waveform is produced. The frequency at which the sine wave is produced is a function of the rate at which counter 25 is clocked. Thus, the CLOCK signal rate and the resulting counter rate operate decoder 24 to produce a desired output sine wave frequency.

One application of the present invention is in a frequency shift keying circuit. Frequency shift keying is a method of encoding binary data by providing a first frequency signal to indicate a high or 'one' logic state and a second frequency signal to indicate a low or 'zero' logic state. In such application the present invention produces a sine wave at a first counter rate to indicate one logic state and at a second counter rate to indicate a second logic state.

To provide a smooth sine wave output for each chosen output frequency, as shown in FIG. 3, a filter is required. A filter capacitor $C_F$ is shown coupled between the output terminal and the inverting input terminal of amplifier 26. The value of capacitor $C_F$ is chosen so that, in conjunction with the values of capacitors $C_A$-$C_D$, the rate of clocking of switches CL1 and CL2, the frequency of the sine wave to be synthesized, and the value of the reference voltage $V_{REF}$, a suitable amplitude of sine wave is generated.

In a frequency shift keying circuit, where signals of two different frequencies are generated, a second capacitor $C_V$ may be selectively added in parallel with capacitor $C_F$ to change the time constant of the filter circuit in accordance with the second output frequency produced. In order to produce a sine wave of fixed amplitude, the value of the total capacitance from the output of the amplifier to its inverting input is chosen to be in inverse proportion to the frequency of the sine wave produced. Selection of capacitor $C_V$ is the function of operation of switch S1. In FIG. 2 a control line DATA is shown operating switch S1. In other embodiments of the invention, switch S1 may be electronically or manually operated depending on the application of the present invention. In some embodiments of the invention, more than two output frequencies may be generated. In such case, three or more capacitors may be provided in the filter loop of operational amplifier 26, each capacitor being selectable singly and in combination as necessary to provide a proper time constant for the selected output signal frequency.

The present invention finds immediate application in integrated circuit technology. It readily produces an analog sine wave output signal from a digital synthesis circuit on a common semiconductor wafer substrate without the need of forming hybrid circuitry. The selectable integration constant capacitors, operated in sequence, allow a sine wave to be generated from a common constant reference source voltage, without the need for complex voltage divider circuits that are difficult to accurately fabricate on an integrated circuit substrate.

The sine wave signal generated by the present invention requires only simple filtering. Conventional analog multiplexing sine wave generation circuits produce an output waveform subject to severe degradation due to the spurious harmonic components of the signal produced. The present invention avoids the need to fabricate complex output filter circuits and is thus simpler and less expensive to fabricate on less surface area on an integrated circuit substrate.

It is a primary aim of the present invention is to use a sloped line approximation rather than a staircase approximation for the sine wave. This is achieved by the variable time constant integrator used in the invention.

The effect of this sloped line rather than staircase approximation is to reduce the amplitude at certain harmonic distortion frequencies. A plot of fundamental and harmonic components of an output waveform produced by the present invention is shown in FIG. 5. The plot was produced on a spectrum analyzer of the type manufactured by Hewlett-Packard Corp. of Palo Alto, Calif. The fundamental component of the output waveform is shown at 40 in the Figure. Harmonic content for the sixteenth and seventeenth harmonics of the fundamental is shown at 41 and 42 in the FIG. In the example of FIG. 5, the harmonic components are shown to be at a level about 48 dB below the level of the fundamental.

It is well recognized that if a sine wave of frequency F is approximated by a function with discontinuities at nF (n an integer, 16 in the preferred embodiment of the invention) a harmonic set is produced at:

$fa = (n-1)f$
$fb = (n+1)f$
$fc = (2n-1)f$
$fd = (2n+1)f$

The sloped line approximation compared to the staircase approximation reduces these harmonics by a factor equal to the harmonic number, i.e. the reduction of the harmonics is by:

$fa$: 20 log $(16-1) = -24$ dB
$fb$: 20 log $(16+1) = -25$ dB
$fc$: 20 log $(32-1) = -30$ dB
$fd$: 20 log $(32+1) = -30$ dB et cetera.

The harmonic content reduction provided by the present invention greatly eases the task of any filter used to perform this task.

The present invention further reduces the complexity of the synthesis circuit by using a switched capacitor technique to produce a positive and negative waveform portion by alternate inversion of a mirror image half cycle. As a result, the present invention requires one-half the number of distinct levels or steps required in prior art systems. Thus, a circuit having one-half the complexity produces equivalent precision. Alternately, a circuit of similar complexity provides twice the number of discrete voltage steps, and accordingly twice the precision of prior art techniques having the same component overhead.

I claim:

1. A sine wave synthesizer circuit, comprising:
   an integrator;
   a plurality of selectable integration constant capacitors;
   decoder means, coupled to said selectable integration constant capacitors, for sequential selection of an integration constant capacitor from among said selectable integration constant capacitors at a rate corresponding to a desired sine wave frequency; and
   switch means for alternately coupling said selected integration constant capacitor between a reference source and said integrator at the same time to produce a first sine wave transition direction and 180° out-of-phase to produce a second opposite sine wave transition direction;
   whereby coordinated operation of said decoder means and said switch means operates said integrator to produce a sine wave output signal.

2. The circuit of claim 1, said decoder means further comprising:
   a switch coupled to effect selection of a corresponding one of said integration constant capacitors in response to said decoder means.

3. The circuit of claim 1, said decoder means further comprising:
   counter means for sequencing integration constant capacitor selection at a rate corresponding to said desired sine wave frequency.

4. The circuit of claim 1, said integrator further comprising:
   a filter capacitor for smoothing transitions of said sine wave output signal corresponding to said continual integration constant capacitor selection.

5. The circuit of claim 4, said integrator further comprising:
   at least two filter capacitors, each producing an integration time constant corresponding to a different selected sine wave frequency; and
   means for selecting a corresponding one of said filter capacitors when said circuit is operated to produce a selected frequency sine wave output signal.

6. The circuit of claim 5, said means for selecting further comprising:
   a switch, adapted to receive a frequency select signal, for selecting one of said filter capacitors having a time constant corresponding to said selected sine wave frequency.

7. The circuit of claim 1, said switch means including a switched capacitor circuit comprising:
   a first switch for alternately coupling a first terminal of said selected integration constant capacitor between a reference source and a circuit ground; and
   a second switch, for alternately coupling of second terminal of said selected integration constant capacitor between an integrator input terminal and said circuit ground;
   whereby said switches are continually operated to couple said selected integrator constant capacitors between said reference source and said integrator input terminal at the same time to produce transition of said sine wave in said first direction and 180° out-of-phase to produce transition of said sine wave in said second opposite direction.

8. The circuit of claim 1, formed on a semiconductor wafer substrate.

9. In an integrated circuit, a sine wave synthesizer circuit, comprising:
an integrator;
at least two selectable integration constant capacitors;
a reference source;
at least two switches, one of each coupled in a series with a corresponding one of said integration constant capacitors and operable to select said integration constant capacitor;
decoder means, coupled to said switches, for sequential operation of said switches to select an integration constant capacitor from among said selectable integration constant capacitors in a sequence and at a rate corresponding to a desired sine wave frequency; and
means for effecting switched capacitor phasing of said integration constant capacitors, including:
a first phase switch for alternately coupling a first terminal of a selected integration constant capacitor between a reference source and a circuit ground; and
a second phase switch, for alternately coupling a second terminal of said selected integration constant capacitor between an integrator input and said circuit ground;
whereby operation of said first and second phase switches at the same time produces transition of said sine wave in a first direction; and
whereby operation of said first and second phase switches 180° out-of-phase produces transition of said sine wave in a second, opposite direction, such that coordinated operation of said first and second phase switches and said decoder operates said circuit to produce a sloped line approximation of a sine wave output signal.

10. The circuit of claim 9, further comprising:
an output filter, coupled to said integrator, for smoothing transitions in said sine wave output signal.

11. The circuit of claim 10, said output filter further comprising:
at least two selectable time constant capacitors, each of which corresponds to a different desired sine wave output signal frequency; and
means for selecting one of said filter capacitors to operate said filter at a corresponding desired frequency.

12. The circuit of claim 11, said means for selecting further comprising:
a switch, coupled in a series with one of said capacitors to selectively isolate said capacitor in an open switch position and to couple said capacitor in parallel with said other capacitor in a closed switch position.

13. The circuit of claim 11, formed on a semiconductor wafer substrate.

* * * * *